(12) United States Patent
Kim et al.

(10) Patent No.: US 9,484,362 B2
(45) Date of Patent: Nov. 1, 2016

(54) DISPLAY SUBSTRATE AND METHOD OF MANUFACTURING A DISPLAY SUBSTRATE

(71) Applicant: Samsung Display Co., LTD., Yongin, Gyeonggi-Do (KR)

(72) Inventors: Dae-Ho Kim, Daegu (KR); Hyun-Jae Na, Seoul (KR); Jae-Neung Kim, Seoul (KR); Yu-Gwang Jeong, Anyang-si (KR); Myoung-Geun Cha, Seoul (KR); Sang-Gab Kim, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 50 days.

(21) Appl. No.: 14/262,761

(22) Filed: Apr. 27, 2014

(65) Prior Publication Data

US 2015/0097179 A1      Apr. 9, 2015

(30) Foreign Application Priority Data

Oct. 8, 2013   (KR) ................ 10-2013-0120124

(51) Int. Cl.
*H01L 29/04* (2006.01)
*H01L 27/12* (2006.01)
*H01L 29/417* (2006.01)

(52) U.S. Cl.
CPC ....... *H01L 27/1225* (2013.01); *H01L 27/1244* (2013.01); *H01L 27/1248* (2013.01); *H01L 29/41733* (2013.01)

(58) Field of Classification Search
CPC ........... H01L 27/1214; H01L 27/1251; H01L 27/3244–27/3297; H01L 29/4908; H01L 51/0508–51/0533; H01L 2924/13069; H01L 29/41733; H01L 29/42384; H01L 29/66265; H01L 29/66742–29/6675; H01L 29/7317; H01L 29/786
See application file for complete search history.

(56) References Cited

U.S. PATENT DOCUMENTS

| | | | |
|---|---|---|---|
| 6,051,883 A * | 4/2000 | Nakamura | 257/768 |
| 7,008,830 B2 | 3/2006 | Hwang | |
| 8,283,788 B2 | 10/2012 | Zhang | |
| 2002/0022364 A1 | 2/2002 | Hatta et al. | |
| 2004/0004220 A1 | 1/2004 | Suzuki | |
| 2004/0256619 A1* | 12/2004 | Nomura et al. | 257/66 |
| 2008/0308795 A1* | 12/2008 | Lee et al. | 257/43 |
| 2011/0062432 A1 | 3/2011 | Yamazaki et al. | |
| 2012/0249915 A1* | 10/2012 | Morosawa | H01L 27/1225 349/43 |
| 2012/0319101 A1 | 12/2012 | Sasagawa et al. | |
| 2013/0082253 A1 | 4/2013 | Yamazaki et al. | |

FOREIGN PATENT DOCUMENTS

| | | |
|---|---|---|
| KR | 1019980041089 A | 8/1998 |
| KR | 1020020080559 A | 10/2002 |
| KR | 1020080048734 A | 6/2008 |

* cited by examiner

*Primary Examiner* — Cuong B Nguyen
(74) *Attorney, Agent, or Firm* — Cantor Colburn LLP

(57) ABSTRACT

A display substrate includes an active pattern, a gate electrode, a first insulation layer and a pixel electrode. The active pattern is disposed on a base substrate. The active pattern includes a metal oxide semiconductor. The gate electrode overlaps the active pattern. The first insulation layer covers the gate electrode and the active pattern, and a contact hole is defined in the first insulation layer. The pixel electrode is electrically connected to the active pattern via the contact hole penetrating the first insulation layer. A first angle defined by a bottom surface of the first insulation layer and a sidewall of the first insulation layer exposed by the contact hole is between about 30° and about 50°.

10 Claims, 7 Drawing Sheets

DISPLAY SUBSTRATE AND METHOD OF MANUFACTURING A DISPLAY SUBSTRATE

This application claims priority to Korean Patent Application No. 10-2013-0120124, filed on Oct. 8, 2013, and all the benefits accruing therefrom under 35 U.S.C. §119, the contents of which application are herein incorporated by reference in their entirety.

BACKGROUND

1. Field

The invention relates to a display substrate and a method of manufacturing the display substrate. More particularly, the invention relates to a display substrate having a pixel electrode passing through an insulation layer.

2. Description of the Related Art

Generally, a thin film transistor for driving a pixel in a display device includes a gate electrode, a source electrode, a drain electrode, and an active pattern forming a channel between the source electrode and the drain electrode. Further, the thin film transistor includes an insulation layer for protecting the gate electrode and the active pattern.

The source electrode and the drain electrode (or the pixel electrode) are disposed to extend through the insulation layer, thereby being electrically connected to the active pattern. If the source electrode and the drain electrode have uneven thickness, an electrical contact resistance between the active pattern and the source electrode or the drain electrode may increase, and a contact failure may occur.

SUMMARY

One or more exemplary embodiment provides a display substrate having an improved electrical contact resistance between elements thereof.

One or more exemplary embodiment provides a method of manufacturing a display substrate having an improved electrical contact resistance between elements thereof.

According to an exemplary embodiment, there is provided a display substrate including an active pattern, a gate electrode, a first insulation layer and a pixel electrode. The active pattern is disposed on a base substrate. The active pattern includes a metal oxide semiconductor. The gate electrode overlaps the active pattern. The first insulation layer covers the gate electrode and the active pattern, and a contact hole is defined in the first insulation layer. The pixel electrode is electrically connected to the active pattern via the contact hole penetrating the first insulation layer. A first angle defined by a bottom surface of the first insulation layer, and a sidewall of the first insulation layer exposed by the contact hole, is between about 30° and about 50°.

In an exemplary embodiment, the first insulation layer may include silicon oxide, silicon nitride, silicon oxy nitride or aluminum oxide.

In an exemplary embodiment, the pixel electrode may include a transparent conductive material.

In an exemplary embodiment, a top surface of the first insulation layer may contact a bottom surface of the pixel electrode, and a bottom surface of the first insulation layer may contact a top surface of the active pattern.

In an exemplary embodiment, the display substrate may further comprise a second insulation layer between the first insulation layer and the pixel electrode.

In an exemplary embodiment, a second angle defined by a bottom surface of the second insulation layer, and a sidewall of the second insulation layer exposed by the contact hole, may be between about 30° and about 50°.

In an exemplary embodiment, the first angle may be smaller than the second angle.

In an exemplary embodiment, a portion of the pixel electrode disposed on a top surface of the active pattern, a top surface of the first insulation layer and a sidewall of the first insulation layer may have a uniform thickness of about 500 angstroms (Å) to about 600 Å.

In an exemplary embodiment, the pixel electrode may have an electrical contact resistance below about 1.0E4 ohms ($\Omega$).

In an exemplary embodiment, the display substrate may further comprise a gate insulation layer pattern between the active pattern and the gate electrode, and a source electrode electrically connected to the active pattern.

According to another exemplary embodiment, there is provided a method of manufacturing a display substrate. In the method, an active pattern is formed on a base substrate. A gate electrode is formed to overlap the active pattern. A first insulation layer is formed to cover the active pattern and the gate electrode. The first insulation layer is partially removed to form a contact hole exposing a portion of the active pattern. A pixel electrode is formed on a top surface of active pattern, a top surface of the first insulation layer and a sidewall of the first insulation layer exposed by the contact hole. A first angle defined by a bottom surface of the first insulation layer and a sidewall of the first insulation layer exposed by the contact hole is between about 30° and about 50°.

In an exemplary embodiment, the partially removing the first insulation layer may include performing a dry etching process using a first etching gas including fluorine and a second etching gas including oxygen.

In an exemplary embodiment, a ratio between a first etching gas flow rate and total etching gas flow rate may be above about 70%, in the dry etching process.

In an exemplary embodiment, the first etching gas may include $F_2$, $NF_3$, $CF_4$, $SF_6$ or $C_4F_8$, and the second etching gas may include $O_2$ or $O_3$.

In an exemplary embodiment, plasma may be generated during the dry etching process.

In an exemplary embodiment, the dry etching process may include doping impurities into the portion of the active pattern exposed by the contact hole.

In an exemplary embodiment, the dry etching process may be performed at a pressure of about 1 millitorr (mTorr) to about 760 torr (Torr).

In an exemplary embodiment, performing the dry etching process may include forming a photoresist pattern on the first insulation layer, the photoresist pattern including an organic material, and the partially removing the first insulation layer using the photoresist pattern as an etching mask.

According to one or more exemplary embodiment, a display substrate thin film transistor may include a first insulation layer covering an active pattern and a gate electrode. Further, a pixel electrode on the first insulation layer may be electrically connected to the active pattern by a contact hole passing through the first insulation layer. A first angle defined by portions of the first insulation layer may be between about 30° and about 50°, so that the pixel electrode disposed on the sidewalls of the first insulation layer may have a uniform thickness thereby reducing the electrical contact resistance of the pixel electrode.

BRIEF DESCRIPTION OF THE DRAWINGS

The above and other features and advantages will become more apparent by describing exemplary embodiments thereof with reference to the accompanying drawings, in which.

DETAILED DESCRIPTION

Figure 1:
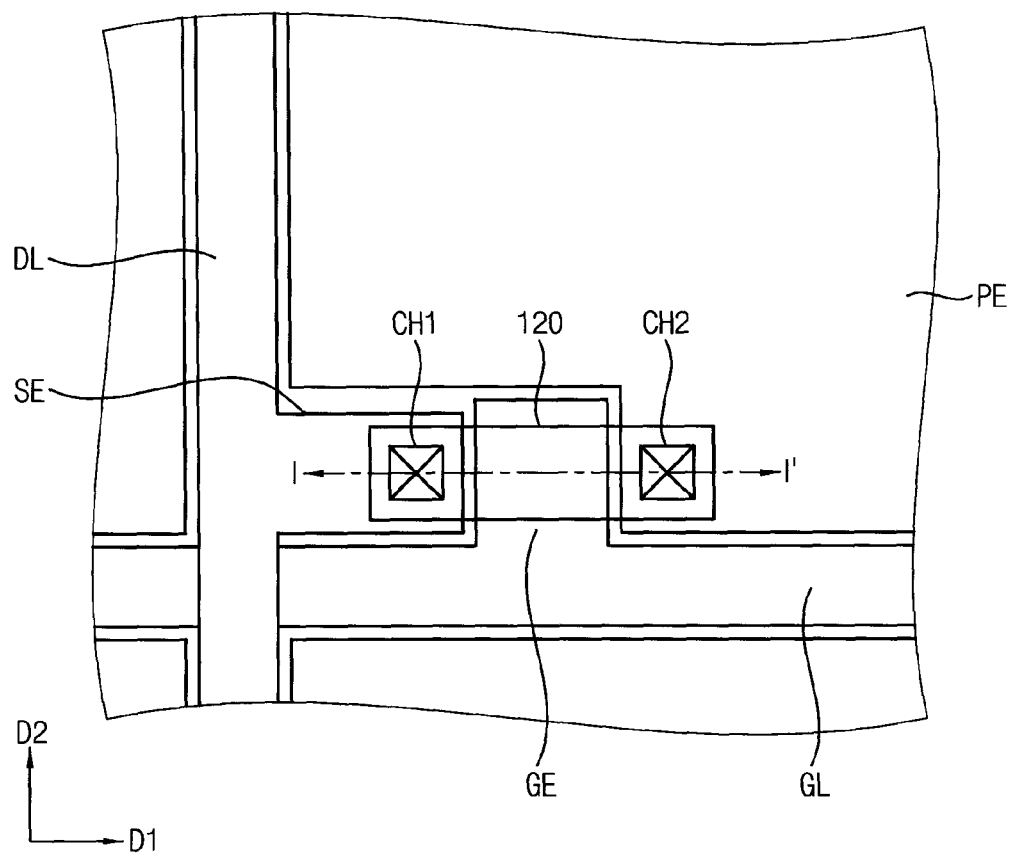
FIG. 1 is a plan view illustrating an exemplary embodiment of a display substrate according to the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be explained in detail with reference to the accompanying drawings.

Figure 2:
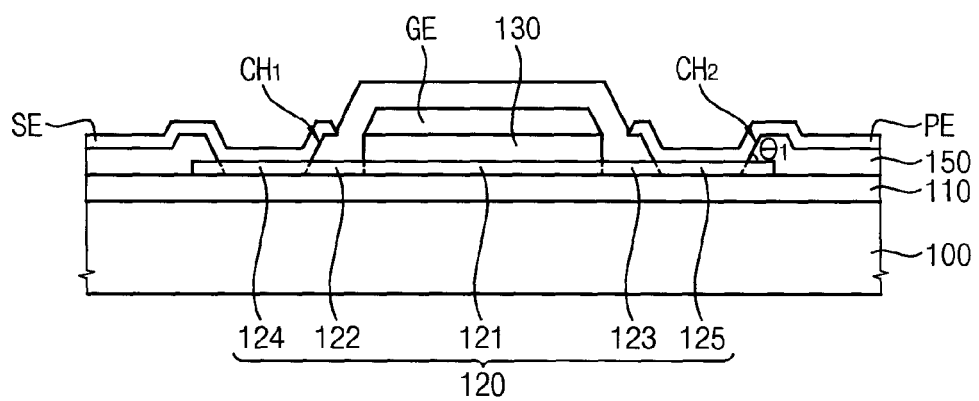
FIG. 2 is a cross-sectional view taken along line I-I' of FIG. 1.

FIG. 1 is a plan view illustrating an exemplary embodiment of a display substrate according to the invention, and FIG. 2 is a cross-sectional view taken along line I-I' of FIG. 1.

Referring to FIGS. 1 and 2, the display substrate includes a base substrate 100, a gate line GL, a data line DL, a thin film transistor, a pixel electrode PE, a first insulation layer 150, and the like. Further, the thin film transistor includes a gate electrode GE, an active pattern 120, a gate insulation layer pattern 130 and a source electrode SE.

The gate line GL extends in a first direction D1 and is disposed above the base substrate 100. The gate electrode GE may be physically and/or electrically connected to the gate line GL. In one exemplary embodiment, for example, the gate electrode GE may protrude from the gate line GL in a second direction D2 inclined with respect to the first direction D1.

An inorganic insulation layer 110 is disposed on the base substrate 100. In exemplary embodiments, for example, the inorganic insulation layer 110 may include an insulation material such as silicon oxide (SiOx), silicon nitride (SiNx), silicon oxy-nitride (SiOxNy), aluminum oxide (AlOx), etc. The inorganic insulation layer 110 may have a substantially flat top surface. The inorganic insulation layer 110 may reduce or effectively prevent a reflection of an external light from the gate electrode GE and the gate line GL, so that an image quality of a display apparatus including the display substrate may be improved. That is, the inorganic insulation layer 110 may serve as a buffer layer.

In other exemplary embodiments, the inorganic insulation layer 110 may be omitted as necessary.

The active pattern 120 is disposed on the inorganic insulation layer 110. In one exemplary embodiment, for example, the active pattern 120 may extend in the first direction D1.

The active pattern 120 may include a metal oxide semiconductor. That is, the active pattern 120 may include an oxide of indium, zinc, gallium, tin or hafnium, but is not limited thereto. In exemplary embodiments, for example, the metal oxide semiconductor may include zinc oxide (ZnO), zinc tin oxide ("ZTO"), zinc indium oxide ("ZIO"), indium oxide (InO), titanium oxide (TiO), indium gallium zinc oxide ("IGZO") or indium zinc tin oxide ("IZTO").

The active pattern 120 may be divided into a first region 121, a second region 122, a third region 123, a fourth region 124 and a fifth region 125 depending on an impurity concentration. In exemplary embodiments, the second region 122 and the third region 123 may be spaced apart from each other in the first direction D1, and the first region 121 may be disposed between the second region 122 and the third region 123. Further, the fourth region 124 and the fifth region 125 may be disposed within the second region 122 and the third region 123, respectively. That is, the second region 122 and the third region 123 may include the fourth region 124 and the fifth region 125, respectively.

The first region 121 may be overlapped with the gate insulation layer pattern 130 that will be described as follow. The first region 121 may have an electrical conductivity that corresponds to that of a semiconductor. In an exemplary embodiment, the first region 121 may serve as a channel region of the thin film transistor.

The second region 122 and the third region 123 may be disposed adjacent to the first region 121 and respectively at opposing sides of the first region 121. Each of the second region 122 and the third region 123 may have an impurity concentration (e.g., hydrogen) that is substantially larger than the impurity concentration of the first region 121. Further, each of the second region 122 and the third region 123 may have an electrical conductivity that is substantially larger than the electrical conductivity of the first region 121. In an exemplary embodiment, the second region 122 may serve as a source region of the thin film transistor, and the third region 123 may serve as a drain region of the thin film transistor.

Each of the fourth region 124 and the fifth region 125 may have an impurity concentration (e.g., fluorine) that is substantially larger than that of a remaining portion of the second region 122 and the third region 123, respectively. Therefore, each of the fourth region 124 and the fifth region 125 may have an electrical conductivity that is substantially larger than that of the remaining portion of the second region 122 and the third region 123, respectively. In an exemplary embodiment, the fourth region 124 and the fifth region 125 may directly contact the source electrode SE and the pixel electrode PE, respectively, but the invention is not limited thereto.

The gate insulation layer pattern 130 is disposed on the active pattern 120. The gate insulation layer pattern 130 may include an insulation material such as silicon oxide or aluminum oxide.

The gate insulation layer pattern 130 in FIG. 2 may have a single layered structure. However, the invention is not limited thereto. In exemplary embodiments, for example, the gate insulation layer pattern 130 may have a multi layered structure including a lower gate insulation layer pattern and an upper gate insulation layer pattern that may be stacked sequentially. Where the gate insulation layer pattern 130 has a multi layered structure, the lower gate insulation layer pattern that may directly contact the active pattern 120 may have a relatively small impurity concentration. Therefore, the gate insulation layer pattern 130 may prevent a diffusion of impurities from the gate insulation layer pattern 130 into the active pattern 120.

The gate line GL and the gate electrode GE are disposed on the gate insulation layer pattern 130. The gate line GL may extend in the first direction D1 on the gate insulation layer pattern 130. The gate electrode GE is electrically connected to the gate line GL. In one exemplary embodiment, for example, the gate electrode GE may protrude from the gate line GL in the second direction D2.

The gate line GL and the gate electrode GE may include copper, silver, chromium, molybdenum, aluminum, titanium, manganese, alloy thereof, nitride thereof and the like. The gate line GL and the gate electrode GE may have a single layered structure or a multi layered structure.

The first insulation layer 150 covers the active pattern 120, the gate insulation layer pattern 130 and the gate electrode GE. The first insulation layer 150 may include an inorganic insulation material such as silicon oxide (SiOx), silicon nitride (SiNx), silicon oxy nitride (SiOxNy) or aluminum oxide (AlOx). In one exemplary embodiment, for example, the first insulation layer 150 may have a cross-sectional thickness of about 500 angstroms (Å) to about 4,000 Å.

In an exemplary embodiment, the first insulation layer 150 may have a single layered structure including silicon nitride. The first insulation layer 150 may serve as a passivation layer for protecting the active pattern 120 and the gate electrode GE. That is, the display substrate may include the passivation layer having the single layered structure.

When the first insulation layer 150 includes silicon nitride, impurities (e.g., hydrogen) in the first insulation layer 150 may be diffused into the second region 122 and the third region 123 of the active pattern 120. On the contrary, the first region 121 of the active pattern 120 is covered by the gate insulation layer pattern 130, such that impurities (e.g., hydrogen) in the first insulation layer 150 may not be diffused into the first region 121.

The data line DL, the source electrode SE and the pixel electrode PE may be disposed on the first insulation layer 150.

The data line DL, the source electrode SE and the pixel electrode PE may include a transparent conductive material. In exemplary embodiments, for example, the transparent conductive material may include amorphous indium-zinc oxide ("α-IZO"), amorphous indium-tin oxide ("α-ITO"), etc. The data line DL, the source electrode SE and the pixel electrode PE may have a cross-sectional thickness of about 400 Å to about 700 Å. More particularly, the data line DL, the source electrode SE and the pixel electrode PE may have a cross-sectional thickness of about 500 Å to about 600 Å. The pixel electrode PE having the above-described cross-sectional thickness may have a desired electrical conductivity and a desired light transmittance.

The data line DL may extend in the second direction D2. The source electrode SE may be electrically connected to the data line DL. In one exemplary embodiment, for example, the source electrode SE may protrude from the data line DL in the first direction D1. Alternatively, the source electrode SE may be electrically connected to the data line DL.

The source electrode SE and the pixel electrode PE may respectively contact the active pattern 120 by contact holes CH1 and CH2 defined passing through the first insulation layer 150. In an exemplary embodiment, for example, the source electrode SE may contact the fourth region 124 of the active pattern 120 via the first contact hole CH1, and the pixel electrode PE may contact the fifth region 125 of the active pattern 120 via the second contact hole CH2.

That is, the source electrode SE may be disposed on a top surface of the active pattern 120 exposed by the first contact hole CH1 and a sidewall of the first insulation layer 150 at the first contact hole CH1. The pixel electrode PE may be disposed on a top surface of the active pattern 120 exposed by the second contact hole CH2 and a sidewall of the first insulation layer 150 at the second contact hole CH2.

A first angle $\theta 1$ may be defined by a bottom surface of the first insulation layer 150 (e.g., parallel to an upper surface of the base substrate 100) and a sidewall of the first insulation layer 150 exposed by the first and second contact holes CH1 and CH2. Further, the first insulation layer 150 has a single layered structure, so that the sidewall of the first insulation layer 150 may be inclined at the first angle $\theta 1$ uniformly.

The first angle $\theta 1$ may be between about 30 degrees (°) and about 50°. If the first angle $\theta 1$ is below about 30°, an area in a plan view occupied by the sidewall of the first insulation layer 150 may increase, and sizes of the first and second contact holes CH1 and CH2 may not be uniform. If the first angle $\theta 1$ is above about 50°, a thin film disposed on the sidewall of the first insulation layer 150 may have poor step coverage, so that an electrical contact resistance of the pixel electrode PE or the source electrode SE may increase. That is, when the first angle $\theta 1$ is between about 30° to about 50°, the first and second contact holes CH1 and CH2 may have reliable sizes, and the pixel electrode PE or the source electrode SE may have an electrical contact resistance that is relatively small.

In exemplary embodiments, the pixel electrode PE and the source electrode SE may have a uniform thickness on the sidewall of the first insulation layer 150, in a direction normal to the surface on which the first insulation layer 150 is disposed. Therefore, the pixel electrode PE and the source electrode SE may have an electrical contact resistance below about 1.0E4 ohms ($\Omega$). Further, the pixel electrode PE may serve as a drain electrode of the thin film transistor.

FIGS. 3 to 8 are cross-sectional views illustrating an exemplary embodiment of a method of manufacturing a display substrate according to the invention.

Figure 3:
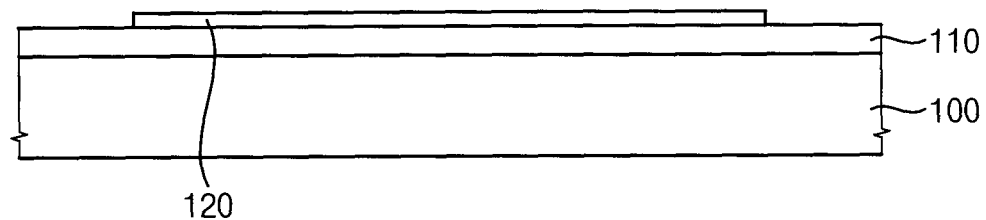
FIGS. 3 to 8 are cross-sectional views illustrating an exemplary embodiment of a method of manufacturing a display substrate according to the invention.

Referring to FIG. 3, an inorganic insulation layer 110 and an active pattern 120 may be formed (e.g., provided) on a base substrate 100.

In exemplary embodiments, the inorganic insulation layer 110 and a metal oxide semiconductor material layer may be formed on the base substrate 100, and then the metal oxide semiconductor material layer may be patterned to form the active pattern 120. The active pattern 120 may have an elongated shape extending in a direction.

The base substrate 100 may include a glass substrate, a quartz substrate, a silicon substrate, a plastic substrate and the like. The inorganic insulation layer 110 may be formed by a chemical vapor deposition ("CVD") process or a spin coating process using silicon oxide (SiOx), silicon nitride (SiNx), silicon oxy nitride (SiOxNy) or aluminum oxide (AlOx) material. The metal oxide semiconductor material layer may be formed by a sputtering process or a thermal evaporation.

After forming the metal oxide semiconductor material layer, an annealing process may be further performed to heat the metal oxide semiconductor material layer. In one exemplary embodiment, the annealing process may be performed at about 100 degrees Celsius (° C.) to about 700° C., and more specifically at about 300° C. to about 400° C. The annealing process may improve electrical characteristics of the metal oxide semiconductor material layer.

Figure 4:
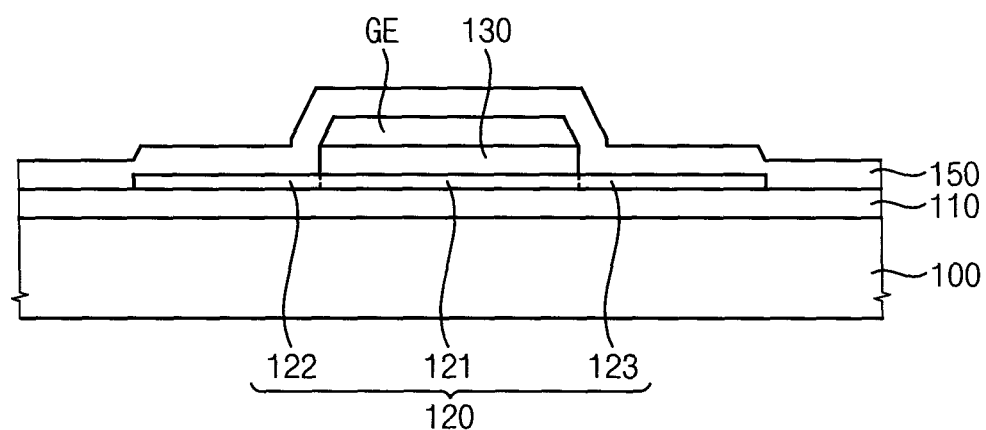

Referring to FIG. 4, a gate insulation layer pattern 130 and a gate electrode GE may be formed on the active pattern 120, and then a first insulation layer 150 may be formed.

In an exemplary embodiment, a gate insulation material layer and a gate electrode material layer may be sequentially formed on the inorganic insulation layer 110 and the active pattern 120, and the gate insulation material layer and the gate electrode material layer may be patterned to form the gate insulation layer pattern 130 and the gate electrode GE. Then, the first insulation layer 150 may be formed to cover the active pattern 120, the gate electrode GE and the gate insulation layer pattern 130.

In exemplary embodiments, after forming the gate electrode GE, the gate insulation material layer under the gate electrode GE may be partially etched using the gate electrode GE as an etching mask. Therefore, the gate electrode GE may overlap the gate insulation layer pattern 130, and the gate insulation layer pattern 130 may be formed without using an additional mask.

During the process for forming the gate electrode GE, a gate line GL electrically connected to the gate electrode GE may be formed simultaneously.

The first insulation layer 150 may be formed by a CVD process, a plasma enhanced CVD ("PECVD") process or an atomic layer deposition ("ALD") process using a material substantially the same as that of the inorganic insulation layer 110. Further, the first insulation layer 150 may have a cross-sectional thickness of about 500 Å to about 4,000 Å.

In some exemplary embodiments, the first insulation layer 150 may have a cross-sectional thickness of about 1,000 Å, and may have a single layered structure including silicon nitride (SiNx).

During the process for forming the first insulation layer 150, impurities may be doped into a portion of the active pattern 120 exposed by the gate electrode GE and the gate insulation layer pattern 130. That is, impurities (e.g., hydrogen) may be partially doped into the active pattern 120 at the exposed portions thereof, when the silicon nitride is deposited for forming the first insulation layer 150.

Therefore, the impurity doped portion of the active pattern 120 may be defined as a second region 122 and a third region 123, and a remaining portion of the active pattern 120 may be defined as a first region 121. That is, each of the second region 122 and the third region 123 may have an impurity concentration (e.g., hydrogen) that is substantially larger than the impurity concentration of the first region 121. Further, each of the second region 122 and the third region 123 may have an electrical conductivity that is substantially larger than the electrical conductivity of the first region 121.

Figure 5:
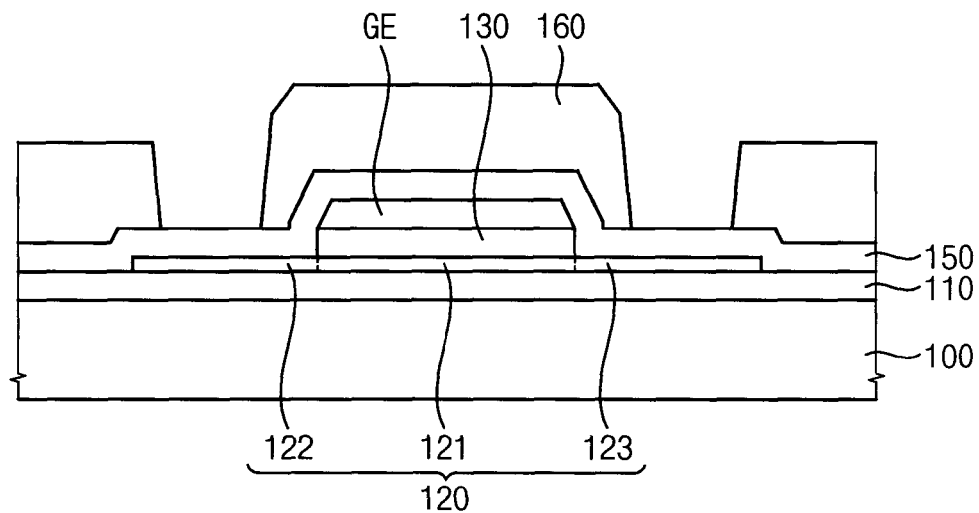

Referring to FIG. 5, a photoresist pattern 160 is formed on the first insulation layer 150.

In an exemplary embodiment, a photoresist material layer may be formed on the first insulation layer 150, and the photoresist material layer may be partially removed to form the photoresist pattern 160. Openings may be defined in the photoresist pattern 160 that expose portions of the first insulation layer 150 for forming contact holes CH1 and CH2 (see FIG. 6) extending through a thickness of the first insulation layer 150. In an exemplary embodiment, for example, the openings may partially overlap the second region 122 and the third region 123 of the active pattern 120, and may not overlap the first region 121 of the active pattern 120.

Figure 6:
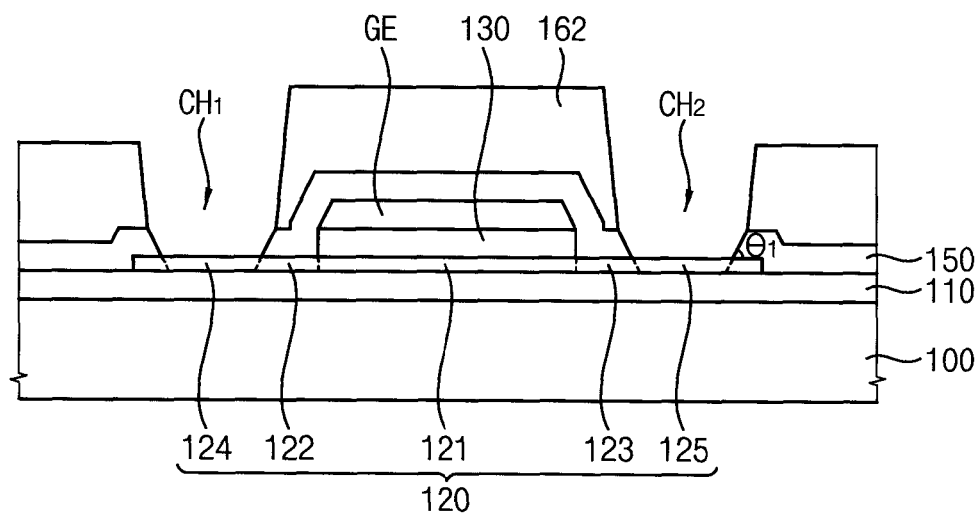
Figure 7:
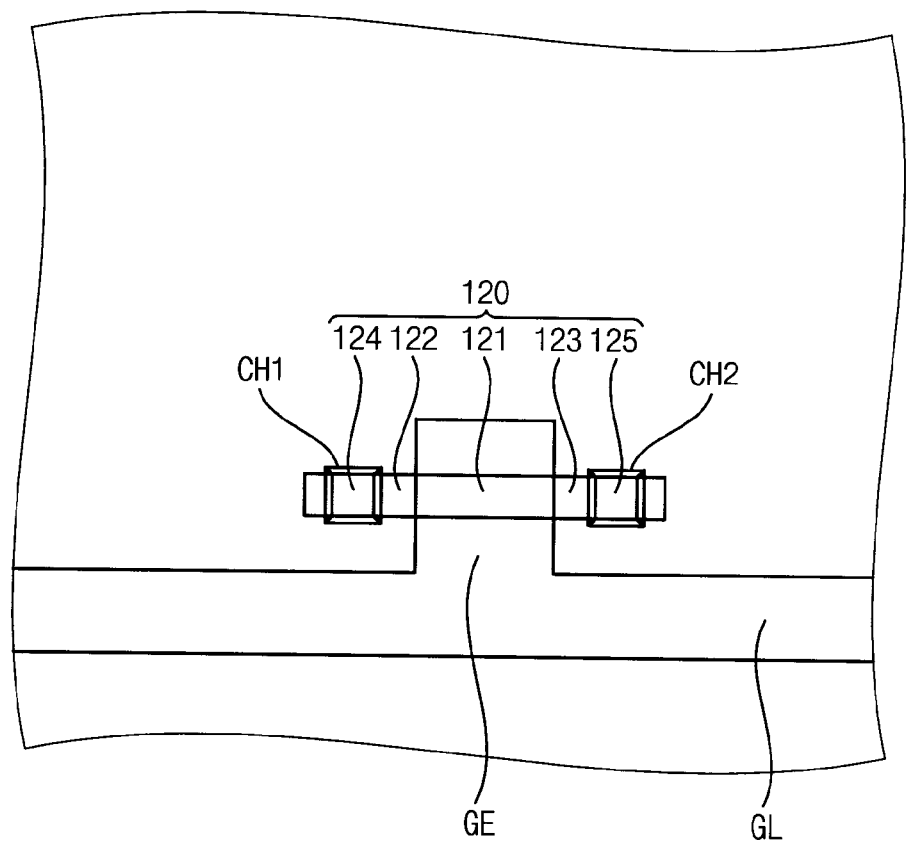

Referring to FIGS. 6 and 7, the first insulation layer 150 is partially removed to form the contact holes CH1 and CH2.

The first insulation layer 150 may be partially removed by performing a dry etching process using the photoresist pattern 160 as an etching mask.

The dry etching process may be performed using a first etching gas including fluorine and a second etching gas including oxygen simultaneously, and plasma may be generated during the dry etching process. Further, the dry etching process may be performed at a pressure of about 1 millitorr (mTorr) to about 760 torr (Torr).

In exemplary embodiments, the first etching gas may include $F_2$, $NF_3$, $CF_4$, $SF_6$, $C_4F_8$, etc., and the second etching gas may include $O_2$, $O_3$, etc. Further, a source radio frequency ("RF") power and a bias RF power for generating plasma may be between about 1 kilowatt (kW) and about 10 kW.

A ratio between flow rates of the first etching gas and the second etching gas may be adjusted as necessary. If the flow rate of the first etching gas is increased, an etching rate about the first insulation layer 150 may increase. In contrast, if the flow rate of the first etching gas is decreased, an etching rate about the photoresist pattern 160 may increase.

Therefore, if the flow rate of the first etching gas is increased, the first insulation layer 150 may be etched rapidly, and the photoresist pattern 160 may be etched slowly, so that a first angle θ1 defined by a bottom surface of the first insulation layer 150 and a sidewall of the first insulation layer 150 may be relatively large.

In contrast, if the flow rate of the first etching gas is decreased, the first insulation layer 150 may be etched slowly, and the photoresist pattern 160 may be etched rapidly. Where the flow rate of the first etching gas is decreased, the opening of the photoresist pattern 160 may be enlarged during the etching process, so that a first angle θ1 defined by a bottom surface of the first insulation layer 150 and a sidewall of the first insulation layer 150 may be relatively small.

In exemplary embodiments, the first etching gas includes $NF_3$ gas, and the second etching gas includes $O_2$ gas. Further, a ratio between the $O_2$ gas flow rate and a total gas flow rate ($O_2/(O_2+NF_3)$) is above about 66.7%. Therefore, the first angle θ1 of the sidewall of the first insulation layer 150 may be below about 50°.

TABLE 1

|  |  | Example and Comparative embodiments | | | | |
| --- | --- | --- | --- | --- | --- | --- |
|  |  | 1 | 2 | 3 | 4 | 5 |
| Pressure (mTorr) |  | 50 | 50 | 50 | 50 | 50 |
| RF power (watts, W) | Source RF power | 3000 | 3000 | 3000 | 3000 | 3000 |
|  | Bias RF power | 1000 | 1000 | 1000 | 1000 | 1000 |
| Gas flow rate (standard cubic | $NF_3$ | 200 | 160 | 133 | 120 | 100 |
| centimeters per minute, sccm) | $O_2$ | 200 | 240 | 266 | 280 | 300 |
| Etch rate | MAX. etch rate | 3622 | 3908 | 2772 | 2530 | 1496 |
| (angstroms per minute, Å/min) | MIN. etch rate | 3292 | 3528 | 2492 | 1882 | 1072 |
|  | Uniformity (percent, %) | 5.1 | 5.2 | 5.3 | 14.5 | 16.7 |
| Process time (seconds, s) |  | 91 s | 85 s | 119 s | 139 s | 246 s |
| First angle (°) |  | 69.8 | 61.6 | 65 | 42.6 | — |

The experimental data in Table 1 shows a relation between the first angle and a ratio of etch gas flow rates. For the experimental data, an IGZO layer having a cross-sectional thickness of about 500 Å was formed on a substrate, and a first insulation material layer was formed on the IGZO layer. The first insulation material layer included silicon nitride and had a thickness of about 4000 Å. Then, a photoresist pattern was formed on the first insulation material layer. Then, a dry etching process using $NF_3$ gas and $O_2$ gas was performed to form a contact hole extending through the first insulation layer. During the dry etching process, a flow rate of $NF_3$ gas and $O_2$ gas was adjusted, and a first angle of a sidewall of the first insulation layer, a maximum etch rate, a minimum etch rate and uniformity were measured.

When a ratio between the $O_2$ gas flow rate and a total gas flow rate ($O_2/(O_2+NF_3)$) was about 66.7%, the first angle was about 65°. On the other hand, when a ratio between the $O_2$ gas flow rate and the total gas flow rate ($O_2/(O_2+NF_3)$) was about 70%, the first angle was about 42.6°. That is, when a ratio between the $O_2$ gas flow rate and the total gas flow rate ($O_2/(O_2+NF_3)$) was above 70%, the first angle is relatively small. Therefore, the first angle decreased, when a ratio between the $O_2$ gas flow rate and the total gas flow rate ($O_2/(O_2+NF_3)$) increased.

In contrast, when a ratio between the $O_2$ gas flow rate and the total gas flow rate ($O_2/(O_2+NF_3)$) was above about 75%, the uniformity of the etch rate was above about 15%. Therefore, the uniformity of the etched first insulation layer degraded. However, when a ratio between the $O_2$ gas flow rate and the total gas flow rate ($O_2/(O_2+NF_3)$) was about 70%, the uniformity of the etch rate was below about 15%.

Consequently, the ratio between $O_2$ gas flow rate and total gas flow rate ($O_2/(O_2+NF_3)$) may be adjusted during the etching process, so that the first angle of the first insulation layer 150 may be between about 30° and about 50°.

By performing the dry etching process, the first contact hole CH1 and the second contact CH2 may be formed through the first insulation layer 150. The first contact hole CH1 may partially expose the second region 122 of the active pattern 120, and the second contact hole CH2 may partially expose the third region 123 of the active pattern 120. During the dry etching process, impurities (e.g., fluorine) may be partially doped into the exposed portions of the second region 122 and the third region 123 of the active pattern 120, thereby forming the fourth region 124 and the fifth region 125, respectively. Therefore, each of the fourth region 124 and the fifth region 125 may have an electrical conductivity that is substantially larger than that of remaining portions of the second region 122 and the third region 123. That is, the fourth region 124 and the fifth region 125 may include impurities which may be not only hydrogen but also fluorine.

Figure 8:
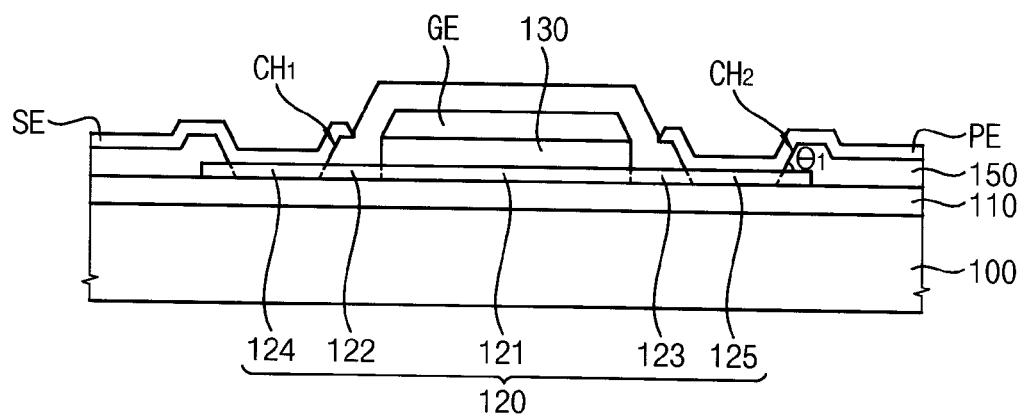

Referring to FIG. 8, a source electrode SE and a pixel electrode PE may be formed on the first insulation layer 150 and the active pattern 120.

In exemplary embodiments, a transparent conductive material layer may be formed on the first insulation layer 150 and the active pattern 120, and then the transparent conductive material layer may be patterned to form the source electrode SE and the pixel electrode PE. The source electrode SE and the pixel electrode PE may include a same material and be disposed in a same layer.

In exemplary embodiments, for example, the transparent conductive material layer may be formed by a sputtering process using α-IZO, α-ITO, etc. The transparent conductive material layer may have a cross-sectional thickness of about 400 Å to about 700 Å. More particularly, the transparent conductive material layer may have a cross-sectional thickness of about 500 Å to about 600 Å. If the cross-sectional thickness of the transparent conductive layer is below about 400 Å, electrical resistance of the source electrode SE and the pixel electrode PE may be too large. If the cross-sectional thickness of the transparent conductive layer is above about 700 Å, light transmittance of the source electrode SE and the pixel electrode PE may be too small.

The transparent conductive material layer may have a uniform thickness on a top surface of the active pattern 120, a top surface and a sidewall of the first insulation layer 150, in a direction normal to the top surfaces. That is, the first angle of the first insulation layer 150 is below about 50°, so that the transparent conductive material layer may have improved step coverage at the contact holes CH1 and CH2. Therefore, the pixel electrode PE and the source electrode SE may have an electrical contact resistance below about 1.0E4Ω.

TABLE 2

|  |  | Example and Comparative embodiments | |
|---|---|---|---|
|  |  | 1 | 2 |
| Gas flow rate (sccm) | NF$_3$ | 133 | 120 |
|  | O$_2$ | 266 | 280 |
| First angle (°) |  | 65 | 42.6 |
| Electrical contact resistance (Ω) |  | 1.42E+06 | 6.93E+03 |

The experimental data in Table 2 shows a relationship between the first angle and the electrical contact resistance.

After forming the contact hole as described with reference to FIG. 1, a sputtering process was performed to form a pixel electrode including indium tin oxide ("ITO") and having a cross-sectional thickness of about 550 Å. Then, the electrical contact resistance of the pixel electrode was measured.

When the first angle of the first insulation layer was about 65°, the electrical contact resistance was about 1.42E+06Ω. That is, when the first angle was above about 50°, the pixel electrode had poor step coverage, so that the electrical contact resistance of the pixel electrode increased. In contrast, when the first angle of the first insulation layer was about 42.6°, the electrical contact resistance was about 6.93E+03 Ω.

Figure 9A:
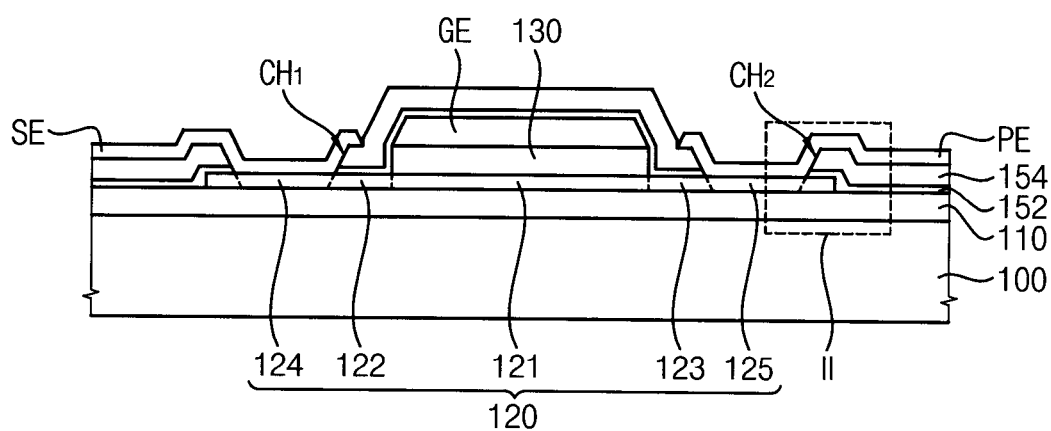
FIG. 9A is a cross-sectional view illustrating another exemplary embodiment of a display substrate according to the invention.
Figure 9B:
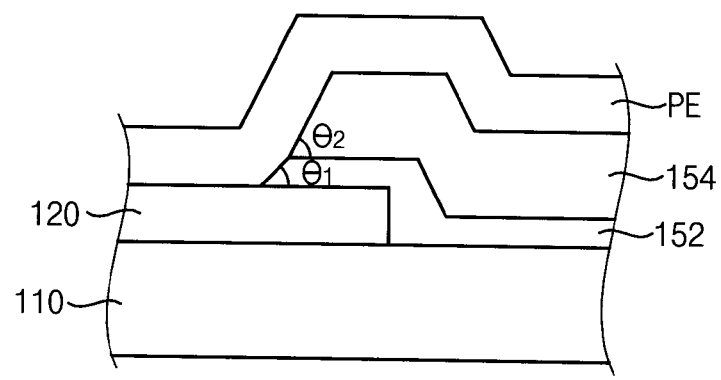
FIG. 9B is an enlarged cross-sectional view of region II of FIG. 9A.

FIG. 9A is a cross-sectional view illustrating another exemplary embodiment of a display substrate according to the invention, and FIG. 9B is an enlarged cross-sectional view of region II of FIG. 9A. The display substrate of FIG. 9A and FIG. 9B is substantially similar to the display substrate of FIG. 1 and FIG. 2 except for the insulation layer.

Referring to FIGS. 9A and 9B, the display substrate may include a base substrate 100, a gate line, a data line, a thin film transistor, a pixel electrode PE, a first insulation layer 152 and a second insulation layer 154. Further, the thin film transistor includes a gate electrode GE, an active pattern 120, a gate insulation layer pattern 130 and a source electrode SE.

An inorganic insulation layer 110 and the active pattern 120 are disposed on the base substrate 200. The active pattern 120 may be divided into a first region 121, a second region 122, a third region 123, a fourth region 124 and a fifth region 125 depending on an impurity concentration. The gate insulation layer pattern 130 and the gate electrode GE are sequentially stacked on the active pattern 120.

The first insulation layer 152 and the second insulation layer 154 are disposed to cover the active pattern 120, the gate insulation layer pattern 130 and the gate electrode GE.

The first insulation layer 152 and the second insulation layer 154 may include silicon oxide (SiOx), silicon nitride (SiNx), silicon oxy nitride (SiOxNy) or aluminum oxide (AlOx).

In some exemplary embodiments, the first insulation layer 152 and the second insulation layer 154 may include different materials from each other. In one exemplary embodiment, for example, the first insulation layer 152 may include silicon nitride, and the second insulation layer 154 may include silicon oxide.

In other exemplary embodiments, the first insulation layer 152 and the second insulation layer 154 may include the same or substantially similar materials. In one exemplary embodiment, for example, the first insulation layer 152 and the second insulation layer 154 may each include silicon nitride. Where the first insulation layer 152 and the second insulation layer 154 include the same material, the first insulation layer 152 may be formed by a deposition process which may have a deposition rate substantially smaller than that of the second insulation layer 154. Therefore, the first insulation layer 152 contacting the active pattern 120 may have a relatively high density, and the process time for forming the second insulation layer 154 may be decreased.

Each of the first insulation layer 152 and the second insulation layer 154 may have a cross-sectional thickness of about 300 Å to about 2000 Å. Further, a sum of cross-sectional thicknesses of the first insulation layer 152 and the second insulation layer 152 may be between about 500 Å and about 4000 Å. In exemplary embodiments, the second insulation layer 154 may have a cross-sectional thickness larger than a cross-sectional thickness of the first insulation layer 152.

The first insulation layer 152 and/or the second insulation layer 154 may serve as a passivation layer for protecting the active pattern 120 and the gate electrode GE. That is, the collective passivation layer may have a multi layered structure.

The source electrode SE and the pixel electrode PE may be disposed on the second insulation layer 154, such as in a same layer of the display substrate. The source electrode SE and the pixel electrode PE may be respectively electrically connected to the active pattern 120 by contact holes CH1 and CH2 disposed through both the first insulation layer 152 and the second insulation layer 154.

Referring now to FIG. 9B, a first angle θ1 may be defined by a bottom surface of the first insulation layer 152 and a sidewall of the first insulation layer 152 exposed by the first and second contact holes CH1 and CH2, and a second angle θ2 may be defined by a bottom surface of the second insulation layer 154 and a sidewall of the second insulation layer 154 exposed by the first and second contact holes CH1 and CH2.

The first angle θ1 and the second angle θ2 may be between about 30° and about 50°. If the first angle θ1 or the second angle θ2 is below about 30°, an area occupied by the sidewall of the first insulation layer 152 or the second insulation layer 154 may increase, and sizes of the first and second contact holes CH1 and CH2 may not be uniform. If the first angle θ1 or the second angle θ2 is above about 50°, a thin film disposed on the sidewall of the first insulation layer 152 or the second insulation layer 154 may have poor step coverage. Therefore, an electrical contact resistance of the pixel electrode PE or the source electrode SE may increase.

Further, the first insulation layer 152 may have a density higher than that of the second insulation layer 154, so that an etch rate about the first insulation layer 152 may be smaller than an etch rate about the second insulation layer 154. Therefore, the first angle θ1 may be substantially smaller than the second angle θ2.

According to exemplary embodiments, the passivation layer may have the multi layered structure including the first insulation layer 152 and the second insulation layer 154. The first angle θ1 and the second angle θ2 of the first insulation layer 152 and the second insulation layer 154 may be between about 30° and about 50°, so that the pixel electrode PE and the source electrode SE disposed on the sidewalls of the first insulation layer 152 and the second insulation layer 154 may have a uniform thickness thereby reducing the electrical contact resistance of the pixel electrode PE and the source electrode SE.

Figure 10:
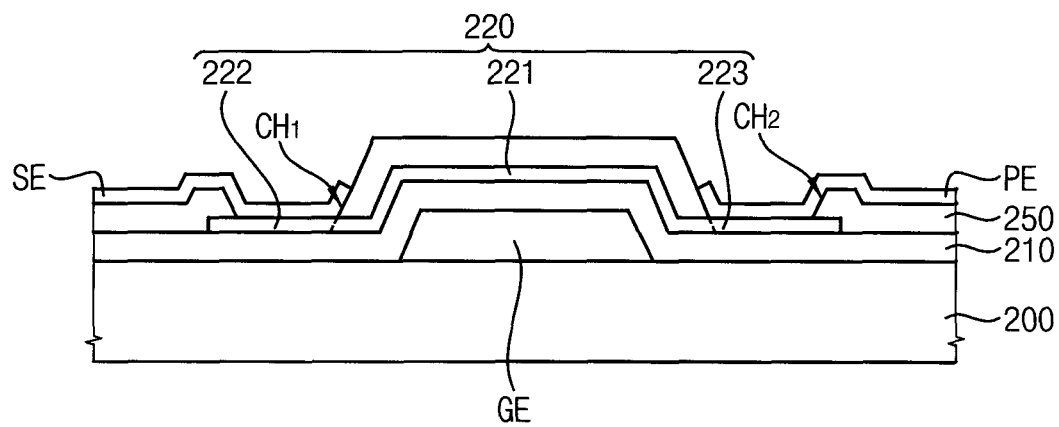
FIG. 10 is a cross-sectional view illustrating still another exemplary embodiment of a display substrate according to the invention.

FIG. 10 is a cross-sectional view illustrating still another exemplary embodiment of a display substrate according to the invention.

Referring to FIG. 10, the display substrate may include a base substrate 200, a gate line, a data line, a thin film transistor, a pixel electrode PE and a first insulation layer 250. Further, the thin film transistor may include a gate electrode GE, a gate insulation layer 210, an active pattern 220 and a source electrode SE.

The gate electrode GE disposed on the base substrate 200 may be electrically connected to the gate line GL. The gate electrode GE may include copper, silver, chromium, molybdenum, aluminum, titanium, manganese, alloy thereof, nitride thereof and the like. The gate electrode GE may have a single layered structure or a multi layered structure.

The gate insulation layer 210 may be disposed on the base substrate 200 to cover the gate electrode GE. In exemplary embodiments, for example, the gate insulation layer 210 may include silicon oxide, silicon nitride or aluminum oxide, and may have a single layered structure or a multi layered structure.

The active pattern 220 may be disposed on the gate insulation layer 210 to partially overlap the gate electrode GE. The active pattern 220 may include a material substantially the same as or similar to that of the active pattern 120 described with reference to FIG. 1. The active pattern 220 may be divided into a first region 221, a second region 222 and a third region 223. The first region 221 may be disposed between the second region 222 and the third region 223 and may serve as a channel of the thin film transistor.

The first insulation layer 250 may be disposed to cover the active pattern 220. In exemplary embodiments, for example, the first insulation layer 250 may include silicon oxide or silicon nitride. The first insulation layer 250 may serve as a passivation layer.

An insulation layer pattern (not illustrated) may be further disposed between the active pattern 220 and the first insulation layer 250. The insulation layer pattern may serve as an etch stopper for protecting the active pattern 220. Further, the insulation layer pattern may prevent a diffusion of impurities (e.g., hydrogen) from the first insulation layer 250f into the active pattern 220.

The source electrode SE and the pixel electrode PE are disposed on the first insulation layer 250.

The source electrode SE and the pixel electrode PE may include a transparent conductive material. In exemplary embodiments, for example, the transparent conductive material may include indium-zinc oxide ("IZO"), ITO, etc. The source electrode SE and the pixel electrode PE may have a cross-sectional thickness of about 500 Å to about 600 Å.

The source electrode SE and the pixel electrode PE may be electrically connected to the active pattern 220 via contact holes CH1 and CH2 disposed through the first insulation layer 250. That is, the source electrode SE may be disposed on a top surface of the active pattern 220 and a sidewall of the first insulation layer 250 exposed by the first contact hole CH1, and the pixel electrode PE may be disposed on a top surface of the active pattern 220 and a sidewall of the first insulation layer exposed by the second contact hole CH2.

A first angle θ1 may be defined by a bottom surface of the first insulation layer 250 and a sidewall of the first insulation layer 250 exposed by the contact holes CH1 and CH2. Further, the first insulation layer 250 may have a single layered structure, so that the sidewall of the first insulation layer 250 may be inclined in the first angle θ1 uniformly.

The first angle θ1 may be between about 30° and about 50°. If the first angle θ1 is below about 30°, an area occupied by the sidewall of the first insulation layer 250 may increase, and sizes of the first and second contact holes CH1 and CH2 may not be uniform. If the first angle θ1 is above about 50°, the pixel electrode PE or the source electrode SE disposed on the sidewall of the first insulation layer 250 may have poor step coverage, so that an electrical contact resistance of the pixel electrode PE or the source electrode SE may increase. That is, when the first angle θ1 is between about 30° to about 50°, the first and second contact holes CH1 and CH2 may have reliable sizes, and the pixel electrode PE or the source electrode SE may have an electrical contact resistance that may be relatively small.

Figure 11:
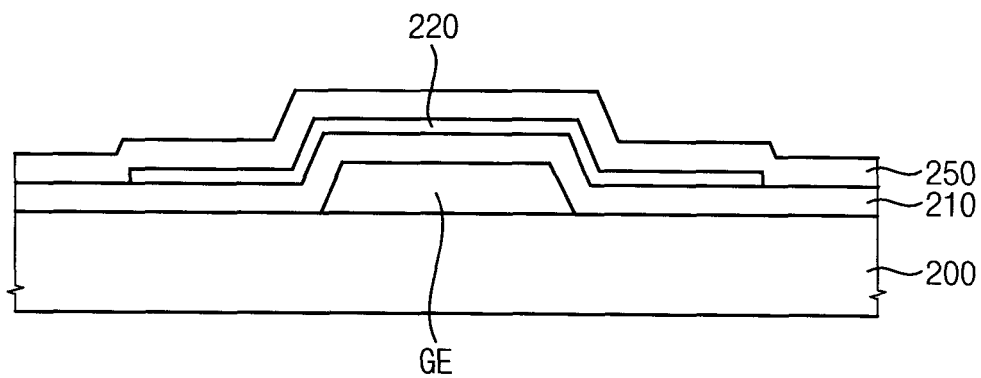
FIGS. 11 to 13 are cross-sectional views illustrating another exemplary embodiment of a method of manufacturing a display substrate according to the invention.
Figure 12:
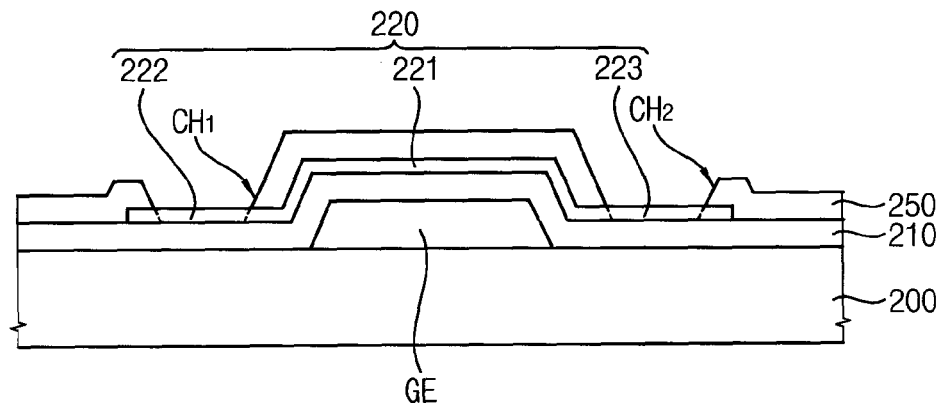
Figure 13:
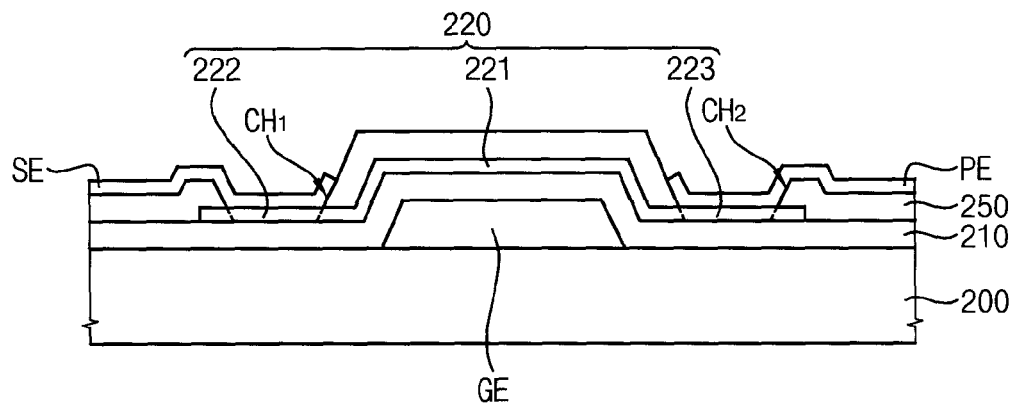

FIGS. 11 to 13 are cross-sectional views illustrating another exemplary embodiment of a method of manufacturing a display substrate according to.

Referring to FIG. 11, a gate electrode GE is formed on a base substrate 200, and a gate insulation layer 210 is formed on the base substrate 200 to cover the gate electrode GE. Then, an active pattern 220 is formed on the gate insulation layer 210, and a first insulation layer 250 may be formed to cover the active pattern 220 and the gate insulation layer 210.

In exemplary embodiments, the active pattern 220 may be formed by a sputtering process using a metal oxide semiconductor material. The first insulation layer 250 may be formed using silicon oxide, silicon nitride or aluminum oxide. In one exemplary embodiment, for example, the first insulation layer 250 may have a cross-sectional thickness of about 500 Å to about 4000 Å.

Referring to FIG. 12, the first insulation layer 250 is partially removed to form a first contact hole CH1 and a second contact hole CH2.

The first and second contact holes CH1 and CH2 may be formed by a dry etching process which may be substantially the same as or similar to the dry etching process described with reference to FIG. 6 and FIG. 7.

Therefore, a first angle θ1 defined by a bottom surface of the first insulation layer 250 and a sidewall of the first insulation layer 250 may be between about 30° to about 50°.

Further, portions of the active pattern 220 may be doped with fluorine during the dry etching process which forms the first and second contact holes CH1 and CH2. Therefore, the active pattern may be divided into a first region 221, a second region 222 and a third region 223. Each of the second region 222 and the third region 223 may have an impurity concentration (e.g., hydrogen) that is substantially larger than the impurity concentration of the first region 221. Further, each of the second region 222 and the third region 223 may have an electrical conductivity that is substantially larger than the electrical conductivity of the first region 221. Portions of the first region 221 are overlapped by the first insulation layer 250.

Referring to FIG. 13, a source electrode SE and a pixel electrode PE may be formed on the first insulation layer 250.

In exemplary embodiments, a transparent conductive material layer may be formed on the first insulation layer 250 and the active pattern 220, the transparent conductive material layer may be partially removed to form the source electrode SE and the pixel electrode PE.

In an exemplary embodiment, for example, the transparent conductive material layer may be formed by a sputtering process using IZO, ITO, etc. The transparent conductive layer may have a cross-sectional thickness of about 500 Å to about 600 Å.

The transparent conductive material layer disposed on the sidewall and the top surface of the first insulation layer 250 and the top surface of the active pattern 220 may have a uniform thickness. That is, when the first angle θ1 is between about 30° to about 50°, the transparent conductive material layer may have improved step coverage. Therefore, the pixel electrode PE and the source electrode SE may have an electrical contact resistance that may be relatively small.

One or more exemplary embodiment of the invention may be used for a display device such as a liquid crystal display device or an organic light emitting diode ("OLED") device.

The foregoing is illustrative of the invention and is not to be construed as limiting thereof. Although a few exemplary embodiments have been described, those skilled in the art will readily appreciate from the foregoing that many modifications are possible in the exemplary embodiments without materially departing from the novel teachings and advantages of the invention. Accordingly, all such modifications are intended to be included within the scope of the invention. In the claims, means-plus-function clauses are intended to cover the structures described herein as performing the recited function and not only structural equivalents but also functionally equivalent structures.

What is claimed is:

1. A display substrate, comprising:
an active pattern on a base substrate, the active pattern comprising a metal oxide semiconductor;
a gate electrode overlapping the active pattern;
a gate insulation layer pattern between the active pattern and the gate electrode;
an insulation member comprising a first insulation layer covering the gate electrode: a portion of the first insulation layer extended to surround a side surface of the gate insulation layer pattern and to contact a top surface of the active pattern,
a contact hole which is defined in the extended portion of the first insulation layer, the contact hole exposing a sidewall of the extended portion of the first insulation layer; and
a pixel electrode in contact with the active pattern at the contact hole to be electrically connected to the active pattern,
wherein a first angle defined by a bottom surface of the insulation member and the a sidewall of the extended portion of the first insulation layer exposed by the contact hole, is between about 30° and about 50°
wherein a portion of the pixel electrode in contact with the active pattern is extended along the exposed sidewall of the extended portion of the first insulation layer, and wherein the extended portion of the pixel electrode has a uniform thickness at the active pattern and along the exposed sidewall of the extended portion of the first insulation layer.

2. The display substrate of claim 1, wherein the insulation member comprises silicon oxide, silicon nitride, silicon oxy nitride or aluminum oxide.

3. The display substrate of claim 1, wherein the pixel electrode comprises a transparent conductive material.

4. The display substrate of claim 1, wherein
a top surface of the insulation member contacts a bottom surface of the pixel electrode, and
the bottom surface of the insulation member contacts the top surface of the active pattern.

5. The display substrate of claim 1, wherein
the insulation member further comprises a second insulation layer between the first insulation layer and the pixel electrode, the second insulation layer covering the gate electrode, a portion of the second insulation layer covering the gate electrode extended to surround the side surface of the gate insulation layer pattern, and
wherein the contact hole is further defined in the extended portion of the second insulation layer and exposes a sidewall of the extended portion of the second insulation layer.

6. The display substrate of claim 5, wherein a second angle defined by a bottom surface of the second insulation layer, and the sidewall of the second insulation layer exposed by the contact hole, is between about 30° and about 50°.

7. The display substrate of claim 6, wherein the first angle is smaller than the second angle.

8. The display substrate of claim 1, wherein the uniform thickness is about 500 angstroms to about 600 angstroms, respectively.

9. The display substrate of claim 1, wherein the pixel electrode has an electrical contact resistance below about 1.0E4 ohms.

10. The display substrate of claim 1, further comprising:
a source electrode electrically connected to the active pattern.

* * * * *